US007205610B2

(12) United States Patent
Koyama

(10) Patent No.: US 7,205,610 B2
(45) Date of Patent: Apr. 17, 2007

(54) SOURCE FOLLOWER CIRCUIT OR BOOTSTRAP CIRCUIT, DRIVER CIRCUIT COMPRISING SUCH CIRCUIT, AND DISPLAY DEVICE COMPRISING SUCH DRIVER CIRCUIT

(75) Inventor: Jun Koyama, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/808,344

(22) Filed: Mar. 25, 2004

(65) Prior Publication Data

US 2004/0188761 A1  Sep. 30, 2004

(30) Foreign Application Priority Data

Mar. 26, 2003 (JP) ............................. 2003-086371

(51) Int. Cl.
*H01L 27/12* (2006.01)
(52) U.S. Cl. ................ 257/348; 257/402; 257/E29.273
(58) Field of Classification Search ................ 257/66, 257/291, 347, 348, 402, E29.273
See application file for complete search history.

(56) References Cited

U.S. PATENT DOCUMENTS

| | | | | |
|---|---|---|---|---|
| 4,929,884 A | * | 5/1990 | Bird et al. ................ | 323/313 |
| 5,015,594 A | * | 5/1991 | Chu et al. ................ | 438/207 |
| 5,899,732 A | * | 5/1999 | Gardner et al. ............ | 438/473 |
| 5,949,107 A | | 9/1999 | Zhang | |
| 5,949,271 A | * | 9/1999 | Fujikura .................... | 327/390 |
| 6,013,930 A | | 1/2000 | Yamazaki et al. | |
| 6,031,249 A | | 2/2000 | Yamazaki et al. | |
| 6,057,183 A | * | 5/2000 | Koyama et al. ........... | 438/166 |
| 6,077,758 A | * | 6/2000 | Zhang et al. .............. | 438/486 |
| 6,087,245 A | * | 7/2000 | Yamazaki et al. ......... | 438/486 |
| 6,127,857 A | * | 10/2000 | Ogawa et al. ............. | 327/94 |
| 6,165,876 A | | 12/2000 | Yamazaki et al. | |
| 6,197,624 B1 | | 3/2001 | Yamazaki | |
| 6,225,866 B1 | | 5/2001 | Kubota et al. | |
| 6,313,819 B1 | | 11/2001 | Maekawa et al. | |
| 6,353,244 B1 | | 3/2002 | Yamazaki et al. | |
| 6,441,399 B1 | | 8/2002 | Koyama et al. | |
| 6,639,246 B2 | | 10/2003 | Honda | |

(Continued)

FOREIGN PATENT DOCUMENTS

JP     11-073165     3/1999

(Continued)

*Primary Examiner*—T. N. Quach
(74) *Attorney, Agent, or Firm*—Eric J. Robinson; Robinson Intellectual Property Law Office, P.C.

(57) ABSTRACT

In the case of using an analog buffer circuit, an input voltage is required to be added a voltage equal to a voltage between the gate and source of a polycrystalline silicon TFT; therefore, a power supply voltage is increased, thus a power consumption is increased with heat. In view of the foregoing problem, the invention provides a depletion mode polycrystalline silicon TFT as a polycrystalline silicon TFT used in an analog buffer circuit such as a source follower circuit. The depletion mode polycrystalline silicon TFT has a threshold voltage on its negative voltage side; therefore, an input voltage does not have to be increased as described above. As a result, a power supply voltage requires no increase, thus a low power consumption of a liquid crystal display device in particular can be realized.

40 Claims, 6 Drawing Sheets

U.S. PATENT DOCUMENTS

| | | | |
|---|---|---|---|
| 6,872,640 B1 * | 3/2005 | Mouli | 438/514 |
| 6,960,498 B2 | 11/2005 | Nakamura | |
| 2002/0142525 A1 | 10/2002 | Ohnuma | |
| 2003/0178682 A1 | 9/2003 | Noda et al. | |
| 2004/0038465 A1 | 2/2004 | Shimomura et al. | |

FOREIGN PATENT DOCUMENTS

| | | |
|---|---|---|
| JP | 2000-194323 | 7/2000 |
| JP | 3201910 | 8/2001 |

* cited by examiner

SOURCE FOLLOWER CIRCUIT OR BOOTSTRAP CIRCUIT, DRIVER CIRCUIT COMPRISING SUCH CIRCUIT, AND DISPLAY DEVICE COMPRISING SUCH DRIVER CIRCUIT

BACKGROUND OF THE INVENTION

1. Field of the Invention

The present invention relates to an analog buffer circuit such as a source follower circuit using a polycrystalline thin film transistor. The invention also relates to a signal driver circuit and an active matrix liquid crystal display device having the source follower circuit of the invention.

2. Description of the Related Art

Recently, a technology regarding a semiconductor device formed on an insulating substrate by using a thin film transistor (hereinafter referred to as a TFT) is rapidly developed. Further, as for a semiconductor device having a polycrystalline semiconductor film by making an amorphous semiconductor film into a polycrystalline semiconductor film by heating or laser irradiation, a pixel portion and a driver circuit can be integrated; therefore, miniaturization and realization of a narrower frame (to increase the ratio of the pixel portion to the display portion) of a semiconductor device are being aimed at.

Meanwhile, a demand and expectation for a large semiconductor device in 15 to 30 inches in size, especially for a liquid crystal display device are growing. Such a large liquid crystal display device is quite thin, light and flexible in design as compared with a CRT display device of the same size.

In such a large liquid crystal display device, as a signal line and a scan line become longer, a wiring resistance increases and a signal is delayed due to the increased load. Therefore, a line sequential drive is performed in which a signal is stored in a memory in a signal driver circuit once and then written to a signal line. In this case, an analog buffer circuit is required to be disposed next to the memory.

A thin film transistor can be used in this analog buffer circuit; however, characteristics of the thin film transistor vary. Therefore, a method for correcting the variation of the thin film transistors is suggested. For example, the difference between a power supply voltage and a difference between an input voltage and a threshold voltage of a transistor is stored in a capacitor, and in the case of output, the input voltage which cancels the threshold value is held by using the transistor (refer to Patent Document 1).

Furthermore, in a source follower circuit configured with polysilicon TFTs, one end of a capacitor is connected to the gate of a source follower transistor, a first analog switch is connected between the gate of the source follower transistor and a precharge power source, a second analog switch is connected between the other end of the capacitor and the source of the source follower transistor, and a third analog switch is connected between the other end of the capacitor and a signal source. Thus, a precharge operation is performed and an offset is canceled at a high precision (refer to Patent Document 2). Patent Document 2 discloses that an NMOS transistor and the source follower transistor are coupled in a cascode configuration, a voltage Vgd between the gate and drain of the source follower transistor is maintained almost constant during the precharge period and the output period, and a depletion mode transistor is used as this cascode connected NMOS transistor.

Patent Document 1: Japanese Patent Application Laid-open No.2000-194323

Patent Document 2: Japanese Patent Application Laid-open No.Hei 11-73165

SUMMARY OF THE INVENTION

These and other objects, features and advantages of the present invention will become more apparent upon reading of the following detailed description along with the accompanied drawings.

However, there is another problem besides the variation in the threshold voltage of TFT in the analog buffer circuit. That is, in the analog buffer circuit, an input voltage is required to be added a voltage between the gate and source of the polycrystalline silicon TFT. Specifically, in the case of using an n-channel polycrystalline silicon TFT, the output potential is decreased by the voltage ($V_{GS}$) between the gate and source of the TFT relatively to the input potential. Therefore, the input voltage is required to be increased by the decreased voltage. As a result, a power supply voltage as well as a power consumption becomes large while generating heat.

Reasons for the abovementioned problem is described now. The voltage ($V_{GS}$) between the gate and source is a sum of a threshold voltage ($V_{th}$) which corresponds to a gate voltage when a drain current (ID) starts flowing, and a voltage at which the drain current reaches saturation. Therefore, a voltage ($V_{GS}$) between the gate and source is dependent on the threshold voltage.

Generally, an absolute value of the threshold voltage of an MOS transistor is approximately 0.3 to 0.7 V and a voltage ($V_{GS}$) between the gate and source of an enhancement mode (normally OFF) n-channel MOS transistor is approximately 0.5 to 1 V. Whereas, a threshold voltage of a polycrystalline silicon TFT is approximately 1.5 to 2 V, which results in a voltage ($V_{GS}$) between the gate and source of the enhancement mode n-channel TFT of 3 V or more.

This is because the threshold voltage of a polycrystalline silicon TFT of which channel forming region is formed of a polycrystalline silicon film becomes large and varies as a result of a process of crystallization and doping impurities, and the surface contamination and the like of a gate insulating film and a semiconductor film.

That is, in the case of forming an analog buffer circuit by using a polycrystalline silicon TFT instead of a MOS transistor, a voltage ($V_{GS}$) between the gate and source of the polycrystalline silicon TFT becomes large and a power supply voltage is increased.

Further, as an example of the analog buffer circuit, a source follower circuit having a constant current source and a TFT is described specifically.

FIG. 5A shows a configuration of a source follower circuit. The source follower circuit shown is configured with a polycrystalline silicon TFT 501 and a constant current source 502. Note that the TFT 501 may be an n-channel transistor or a p-channel transistor. The TFT 501 is turned ON or OFF by a potential (hereinafter referred to as an input potential: Vin) from an input terminal 503, and a voltage (hereinafter referred to as an output voltage: Vout) from an output terminal 504.

FIG. 5B shows a VG-ID characteristics of the n-channel polycrystalline silicon TFT. The VG-ID characteristics of the TFT is set so that ID=0 when VG=0. Thus, a polycrystalline silicon TFT which flows a large drain current (ID) in the case of applying a high voltage to the gate and does not flow a drain current in the case where the gate voltage is 0

V is referred to as an enhancement mode TFT. The enhancement mode TFT controls the conductivity of a TFT by applying the gate voltage.

The TFT 501 used in the source follower circuit shown in FIG. 5A is an enhancement mode TFT. An input voltage having an amplitude of 5 V is inputted as shown in the left diagram of FIG. 5C, for example. Then, an output voltage is decreased by 3 V from an input voltage as a voltage ($V_{GS}$) between the gate and source of the TFT has a predetermined value, for example 3 V (threshold voltage+several voltages). Thus, it is required that a potential of the constant current source 502 be −3 V, and a power source be 19 V in which 3 V is increased as shown in the right diagram of FIG. 5C. As a result, a power supply voltage of a display device and the like is increased, leading to a high power consumption.

Described above is the description of an n-channel polycrystalline silicon TFT. A p-channel polycrystalline silicon TFT can be similarly described by changing a conductivity.

As described above, a large liquid crystal display device is required to be driven by the line sequential drive; therefore, an analog buffer circuit is required to be formed. In particular, using a polycrystalline silicon TFT can realize an integration of a pixel portion and a driver circuit, that is an analog buffer circuit. As an advantage of the integrated liquid crystal display is a low power consumption, increase in power supply voltage as described above is a serious problem.

It is a feature of the invention to operate such an analog buffer circuit as a source follower circuit using a polycrystalline silicon TFT without increasing an input voltage. Further, it is another feature of the invention to provide a signal driver circuit and a liquid crystal display device having the analog buffer circuit of the invention.

In view of the above-described problem, the invention provides a polycrystalline silicon TFT which is a depletion mode (normally ON) TFT used in such an analog buffer circuit as a source follower circuit.

A depletion mode polycrystalline silicon TFT (hereinafter referred to as a depletion mode TFT) has a threshold voltage on its negative voltage side. Therefore, a voltage ($V_{GS}$) between the gate and source of the depletion mode TFT is approximately 0 to 1 V, which does not require an increase in an input voltage as described above. As a result, a power supply voltage does not have to be increased either, thus a low power consumption of a liquid crystal display device can be realized.

By using a polycrystalline silicon TFT, a monolithic liquid crystal display device can be provided in which a pixel portion and an analog buffer circuit, that is a driver circuit (also referred to as an electric circuit) such as a signal driver circuit are integrated. It is needless to say that a driver circuit having the analog buffer circuit of the invention may be formed separately from the pixel portion.

As for a channel forming region of a polycrystalline silicon TFT, a polycrystalline silicon film formed on an insulating surface (for example a quartz substrate and the like) by CVD or the like, or a polycrystalline silicon film formed by crystallization by heating or laser irradiating an amorphous silicon film formed on an insulating surface (for example a glass substrate) may be employed.

In the case of crystallizing by heating, a silicon film may be doped with metal element such as Nickel which is capable of promoting the crystallization of a semiconductor film, and then heated at 450 to 580° C. for about 4 to 12 hours. In the case of crystallizing by laser irradiation, a silicon film may be irradiated by a continuous oscillation laser or a pulse oscillation laser such as an excimer laser and a YAG laser.

Note that referred to as a silicon film is a silicon-based semiconductor film, which may include germanium and the like. That is, a TFT of which channel forming region is formed of a polycrystalline semiconductor film is referred to as a depletion mode TFT.

In the case of forming a depletion mode TFT, impurity may be doped at least to the channel forming region of an active layer of the TFT at a concentration of $5 \times 10^{12}$ to $5 \times 10^{14}$ atoms/cm$^2$. As for the impurity, phosphorous (P) and boron (B) may be used to an n-channel depletion mode TFT and a p-channel depletion mode TFT respectively.

According to the invention as described above, a driver circuit using a polycrystalline silicon TFT can be operated without increasing a power supply voltage than the desired value. As a result, power supply voltage can be maintained low and a low power consumption can be realized in a display device such as a liquid crystal display device having the driver circuit of the invention, a display device having a light emitting element (referred to as a light emitting device), and a semiconductor integrated circuit such as a CPU or a memory.

DETAILED DESCRIPTION THE INVENTION

Hereinafter described with reference to drawings are embodiment modes of the invention. It is to be understood that various changes and modifications will be apparent to those skilled in the art. Therefore, unless otherwise such changes and modifications depart from the scope of the present invention hereinafter defined, they should be construed as being included therein. Note that, in all figures for describing the embodiment modes, the same reference numbers are used for devices or portions that have the same function. Descriptions about the same reference numbers are omitted.

EMBODIMENT MODE 1

A source follower circuit using a depletion mode TFT is described in this embodiment mode.

Figure 1A:
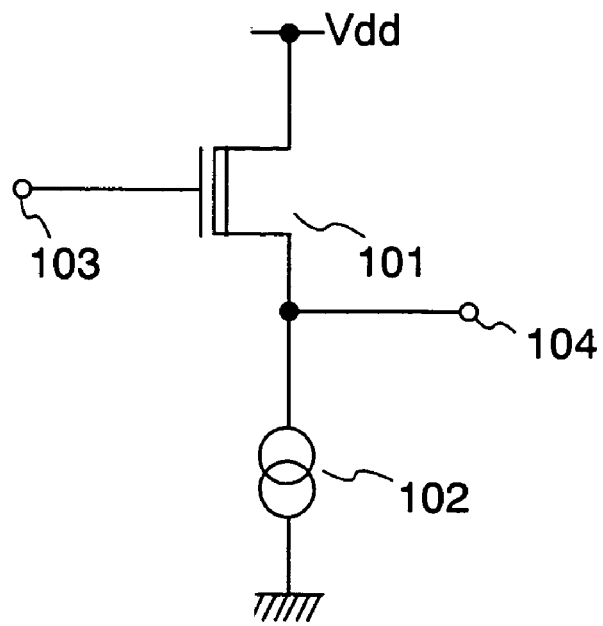
FIGS. 1A and 1B are diagrams showing a source follower circuit of the invention.

FIG. 1A shows a source follower circuit having a depletion mode TFT 101 of the invention, a constant current source 102, an input terminal 103, and an output terminal 104. Further, the depletion mode TFT 101 is connected to a power supply line Vdd. Note that the depletion mode TFT in the drawings of the invention is described by using a symbol as the depletion mode TFT 101.

Figure 1B:
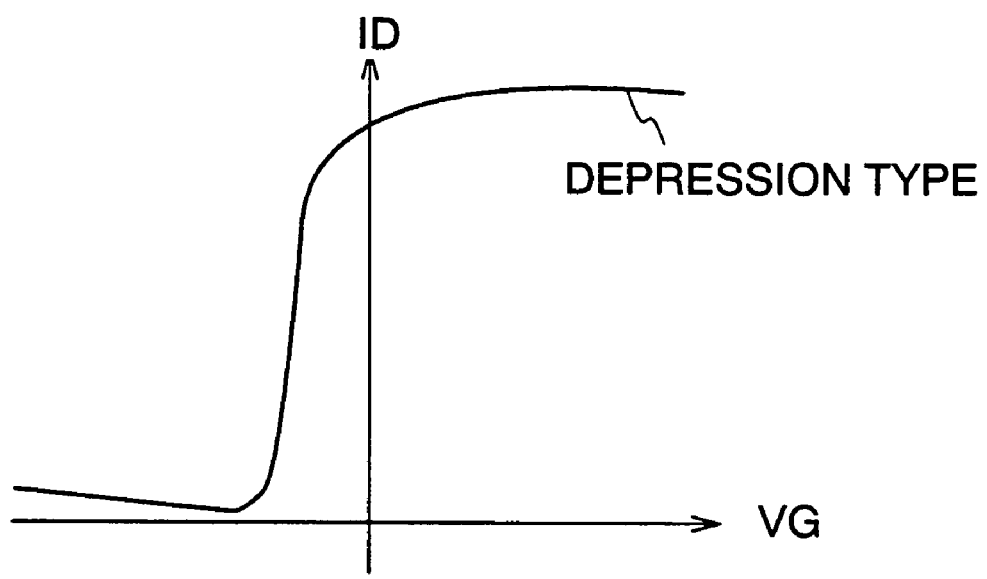

Further, FIG. 1B shows a VG-ID characteristics of the depletion mode TFT. It is found when compared with FIG.

5B that a voltage ($V_{GS}$) between the gate and source of the depletion mode TFT is quite small. That is, the voltage ($V_{GS}$) between the gate and source of the depletion mode TFT is approximately 0 to 1 V; therefore, there is no need to increase an input voltage as described above.

Furthermore, the constant current source 102 may employ a known technique. In the case of using a polycrystalline silicon TFT in particular, a depletion mode TFT is favorably employed.

A source follower circuit of the invention has a basic circuit configuration, and other circuits may be connected to it.

In this manner, by using a depletion mode TFT according to the invention, an input voltage does not have to be increased and a low power consumption can be realized.

The above-described source follower circuit does not require complex configuration nor manufacturing process as compared with other analog buffer circuits such as an operational amplifier circuit. Therefore, the source follower circuit is applicable to a driver circuit having a polycrystalline silicon TFT and a signal driver circuit of a liquid crystal display device in which a pixel portion is integrated.

Note that the invention is different from the invention disclosed in Patent Document 2 which employs a depletion mode transistor as an NMOS transistor in cascode connection in terms of configuration, problem, and effect. That is, in view of the necessity of adding a voltage between the gate and source of a polycrystalline silicon TFT to an input voltage of a source follower circuit, the invention employs a depletion mode polycrystalline silicon TFT as a transistor which is directly connected to an output terminal of the source follower circuit (which corresponds to a source follower transistor in Patent Document 2). As a result, the input voltage of the source follower circuit does not have to be added a voltage between the gate and source of the polycrystalline silicon TFT; therefore, a low power consumption can be realized.

EMBODIMENT MODE 2

In this embodiment mode, a bootstrap circuit using a depletion mode TFT is described.

Figure 2:
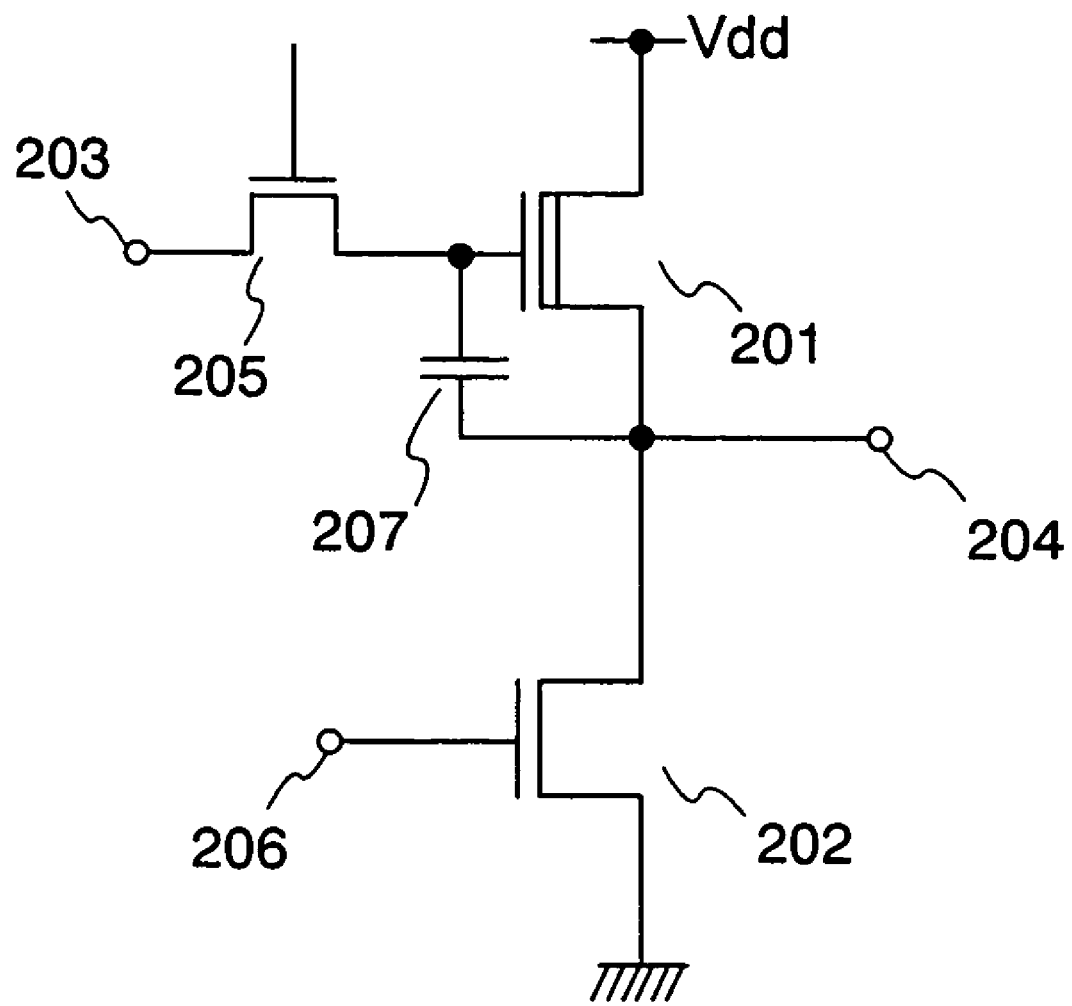
FIG. 2 is a diagram showing a bootstrap circuit of the invention.

FIG. 2 shows a bootstrap circuit having an n-channel depletion mode TFT 201, a TFT 205, an n-channel enhancement mode TFT 202, an input terminal 203, an output terminal 204, an input terminal 206, and a capacitor 207. The depletion mode TFT is connected to a power supply line Vdd.

A bootstrap circuit is operated with the gate voltage of a TFT connected to a power supply line increased to be equal to or more than Vdd; however, it is difficult to actually increase a power source sufficiently due to a parasitic capacitance or the like. However, the depletion mode TFT 201 of the invention does not require as large gate voltage as an enhancement mode TFT. As described above, the depletion mode TFT has a characteristic that the threshold voltage is on its negative voltage side and a voltage ($V_{GS}$) between the gate and source is approximately 0 V, while a voltage ($V_{GS}$) between the gate and source of an polycrystalline silicon TFT is several voltages. As a result, the depletion mode TFT can be turned ON in a predetermined region of a power source VDD, thus the bootstrap circuit of the invention can be operated.

The bootstrap circuit of the invention can be applied to a dynamic circuit such as a shift register or a level shifter.

EMBODIMENT MODE 3

A signal driver circuit using the source follower circuit of the invention is described in this embodiment mode.

Figure 3:
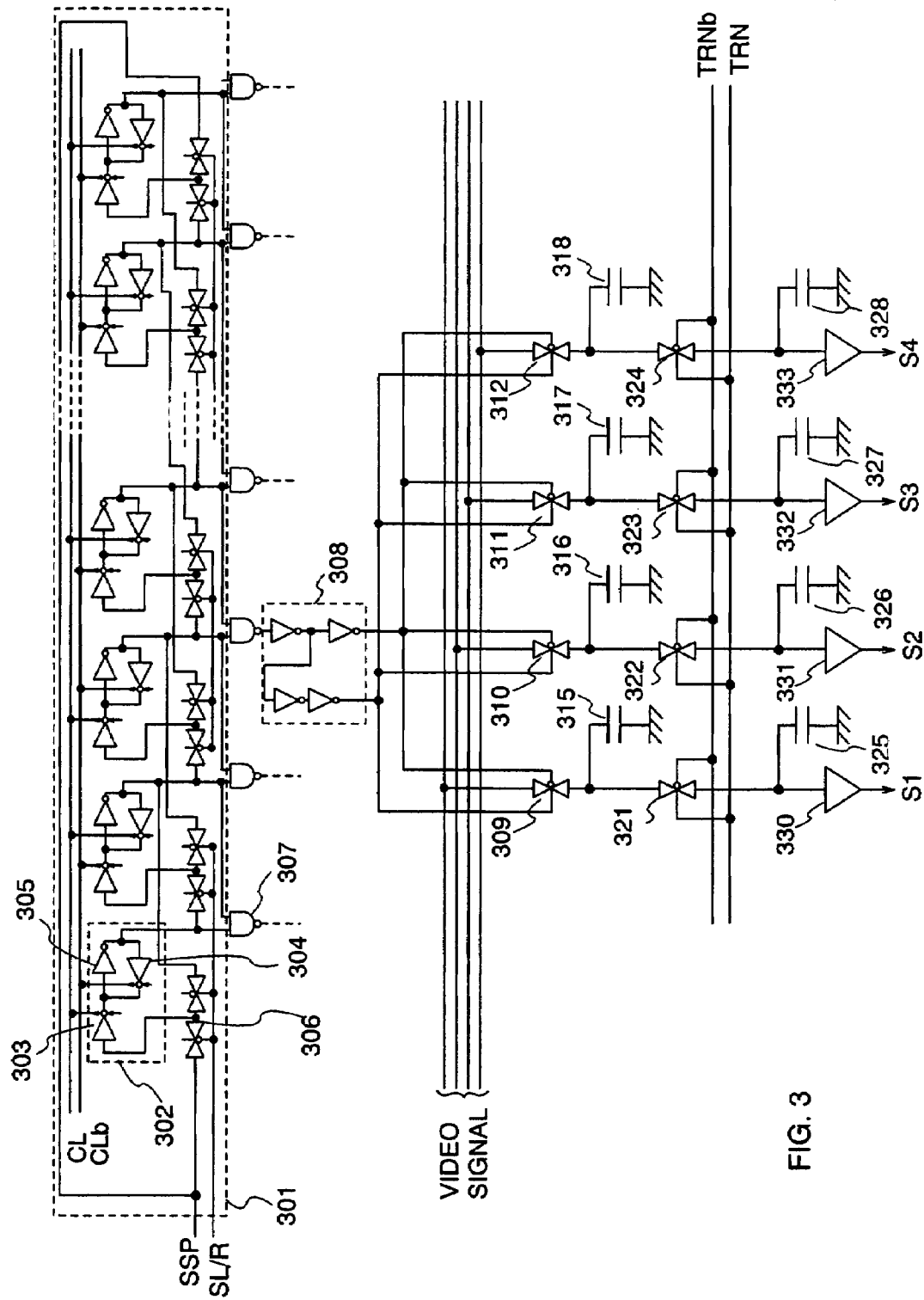
FIG. 3 is a diagram showing a signal driver circuit of the invention.

FIG. 3 shows a signal driver circuit having a shift register 301, a NAND circuit 307, and a buffer circuit 308.

First, a source start pulse SSP is inputted to a first stage of the shift register 301 through a switch 306. The switch 306 defines the scanning direction of the shift register 301. When a scanning direction switching signal SL/R is Lo, scanning is performed from left to right in FIG. 3, and right to left when the signal is Hi. Each stage of the shift register 301 is configured with a DFF (delay flip flop) 302 having clocked inverters 303 and 304 and an inverter 305. A pulse is shifted by the inverters in accordance with an input of a clock pulse CL and CLb.

An output of the shift register 301 is inputted to the buffer circuit 308 through the NAND circuit 307. Analog switches 309 to 312 are turned ON by an output of the buffer circuit 308, and then video signals are sampled to capacitors (hereinafter referred to as analog memories) 315 to 318 which function as analog memories. After one line of data is accumulated in the analog memories sequentially, signals of TRN and TRNb become active in the subsequent flyback period. Then, analog switches 321 to 324 are turned ON. Thus, data in the analog memories 315 to 318 are transferred to capacitors 325 to 328 as analog memories all at once. Such circuit that holds and transfers signals all at once is also referred to as a latch circuit.

It should be noted that an amplitude of an input voltage can be increased without increasing a power supply voltage, by using the bootstrap circuit using the depletion mode TFT as described in Embodiment Mode 2 as a shift register.

For the next sampling, the analog switches 321 to 324 are turned OFF before the switches 309 to 312 are turned ON. The data in the analog memories 325 to 328 are outputted to signal lines S1 to S4 through source follower circuits 330 to 333. The data in the analog memories 325 to 328 are held for the period for one line; therefore, the source follower circuits 330 to 333 can charge the signal lines spending the period for one line. Further, by using a source follower circuit having a depletion mode TFT, a power supply voltage does not have to be increased and a low power consumption signal driver circuit can be provided.

In this manner, a line sequential drive can be performed by using an analog memory and an analog buffer circuit. The above-described signal driver circuit is applicable to a display device such as a large liquid crystal display device in 15 inches or more and a light emitting device.

EMBODIMENT MODE 4

Figure 4A:
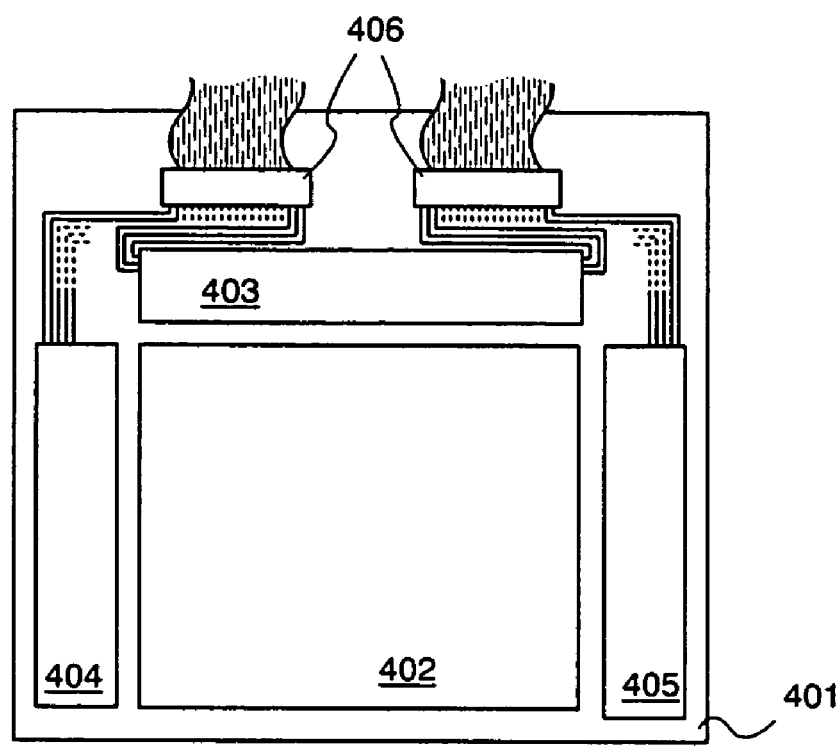
FIGS. 4A and 4B are diagrams showing a display device of the invention.
Figure 4B:
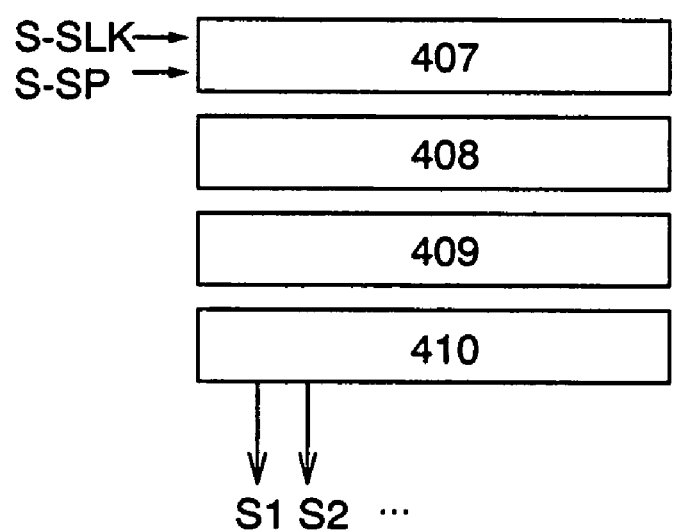
Figure 5A:
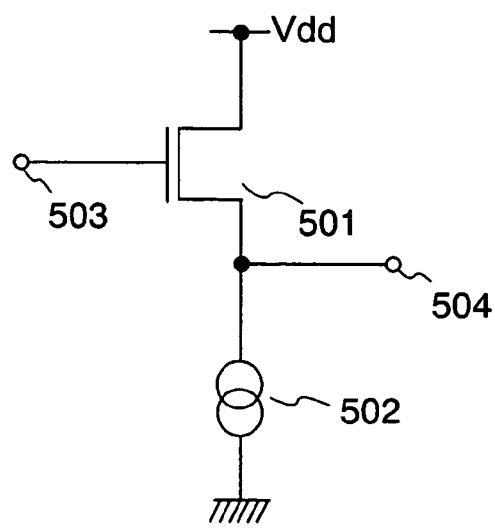
FIGS. 5A to 5C are diagrams showing a conventional source follower circuit.
Figure 5B:
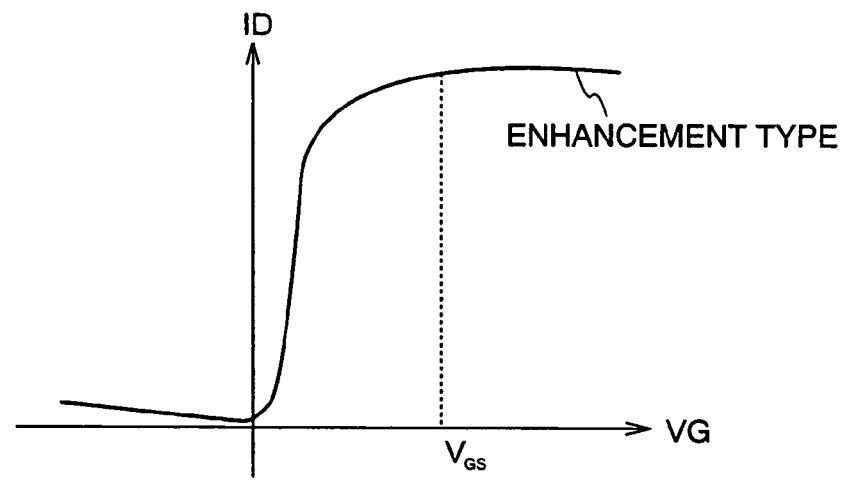
Figure 5C:
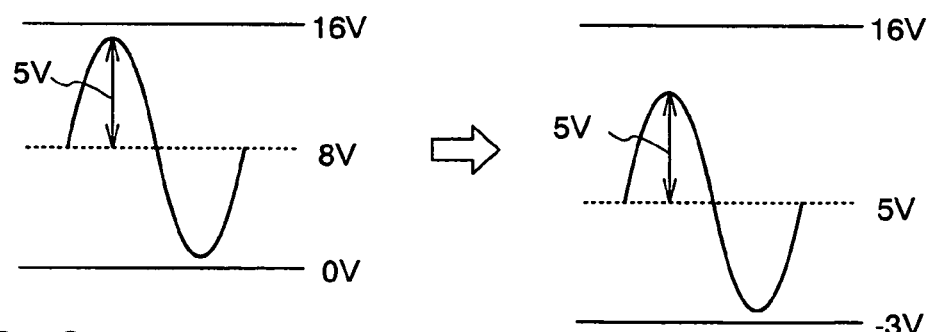

In this embodiment mode, a liquid crystal display device provided with a signal driver circuit having a source follower circuit of the invention is described with reference to FIGS. 4A and 4B.

A liquid crystal display device of the invention comprises a pixel portion 402 on a substrate 401, in which a plurality of pixels are arranged in matrix, a signal driver circuit 403 of the invention, a first scanning driver circuit 404 and a second scanning driver circuit 405 in the periphery of the pixel portion 402. A signal is supplied to the signal driver circuit 403 and the first scanning driver circuit 404 and the second scanning driver circuit 405 externally through an FPC 406. In FIG. 4A, the signal driver circuit 403 and the two scanning driver circuits 404 and 405 are integrated with the pixel portion 402; however, the invention is not limited to this. The signal driver circuit and the scanning driver circuit can be designed in accordance with a pixel configuration.

A configuration of a signal driver circuit is described with reference to FIG. 4B. The signal driver circuit comprises a shift register 407, a switch 408, an analog memory 409, and a source follower circuit 410. The shift register 407 is configured with a plurality of stages of flip-flop (FF) circuits and the like and inputted with a clock signal (S-CLK), a start pulse (S-SP) and the like. A sampling pulse is outputted in accordance with these signals. The outputted signals are inputted to the analog memory 409 sequentially as described in Embodiment Mode 3, and outputted to the signal lines S1, S2, . . . through the source follower circuit 410.

Each of the first scanning driver circuit 404 and the second scanning driver circuit 405 comprise a shift register and a buffer circuit. To describe the operation briefly, the shift register outputs a sampling pulse sequentially in accordance with a clock signal (G-CLK), a start pulse (S-SP), and a clock inversion signal (G-CLKb). After that, a sampling pulse is amplified in the buffer circuit and inputted to a scan line to be in a selected state one line at a time. A signal current is written from the signal lines sequentially in accordance with a timing at which a scan line is selected.

It should be noted that a level shifter circuit may be disposed between the shift register and the buffer circuit. By disposing the level shifter circuit, a voltage amplitude can be increased. The bootstrap circuit of the invention can be applied to the level shifter.

EMBODIMENT MODE 5

Electronic apparatuses, each using an analog buffer circuit such as a source follower circuit of the invention, include a video camera, a digital camera, a goggle display (head mounted display), a navigation system, an audio reproduction device (car audio, audio component and the like), a laptop personal computer, a game apparatus, a portable information terminal (mobile computer, portable telephone, portable game machine or electronic book and the like), an image reproduction apparatus having a recording medium (specifically, apparatus which reproduces a recording medium such as Digital Versatile Disc (DVD) and the like and has a display for displaying its images) and the like. Specific examples of these electronic apparatuses are shown in FIGS. 6A to 6H.

Figure 6A:
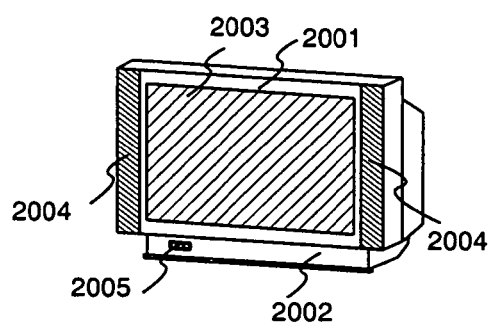
FIGS. 6A to 6H are electronic apparatuses using the invention.

FIG. 6A shows a liquid crystal display device, which includes a housing 2001, a support table 2002, a display portion 2003, a speaker portion 2004, a video input terminal 2005 and the like. The liquid crystal display device comprising the source follower circuit of the invention can be applied to the display portion 2003. According to the invention, a thinner, lighter liquid crystal display device which consumes less power can be provided. Note that all televisions for displaying information, such as personal computer monitors, display devices for receiving TV broadcasting, and display devices for advertising are also included.

Figure 6B:
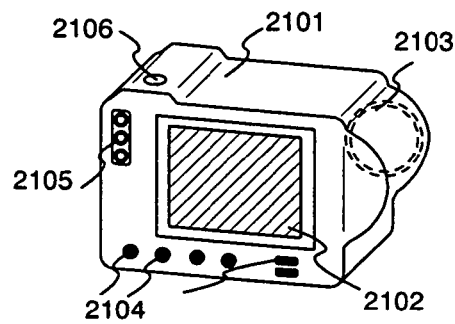

FIG. 6B shows a digital still camera, which includes a main body 2101, a display portion 2102, an image-receiving portion 2103, operation keys 2104, an external connection port 2105, a shutter 2106, and the like. The liquid crystal display device comprising the source follower circuit of the invention can be applied to the display portion 2102.

Figure 6C:
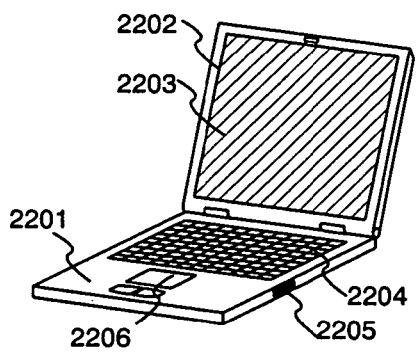

FIG. 6C shows a laptop personal computer, which includes a main body 2201, a housing 2202, a display portion 2203, a keyboard 2204, an external connection port 2205, a pointing mouse 2206, and the like. The liquid crystal display device comprising the source follower circuit of the invention can be applied to the display portion 2203.

Figure 6D:
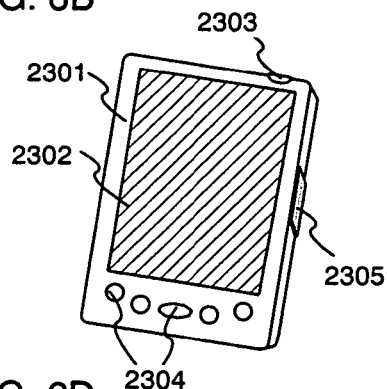

FIG. 6D shows a mobile computer, which includes a main body 2301, a display portion 2302, a switch 2303, operation keys 2304, an infrared port 2305, and the like. The liquid crystal display device comprising the source follower circuit of the invention can be applied to the display portion 2302.

Figure 6E:
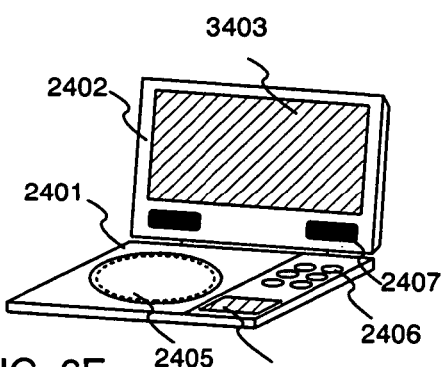

FIG. 6E shows a portable image reproduction apparatus provided with a recording medium (specifically, a DVD reproduction apparatus), which includes a main body 2401, a housing 2402, a display portion A 2403, a display portion B 2404, a recording medium (such as a DVD) read-in portion 2405, an operation key 2406, a speaker portion 2407, and the like. The display portion A 2403 mainly displays image information, and the display portion B 2404 mainly displays text information. The liquid crystal display device comprising the source follower circuit of the invention can be applied to both of the display portions A 2403 and B 2404. Note that image reproduction device provided with a recording medium includes game machines for domestic use and the like.

Figure 6F:
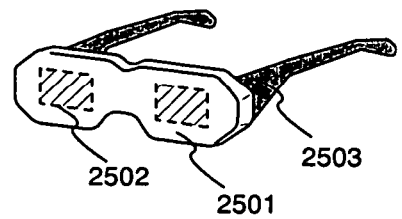

FIG. 6F shows a goggle display (head mounted display), which includes a main body 2501, a display portion 2502, an arm portion 2503, and the like. The liquid crystal display device comprising the source follower circuit of the invention can be applied to the display portion 2502.

Figure 6G:
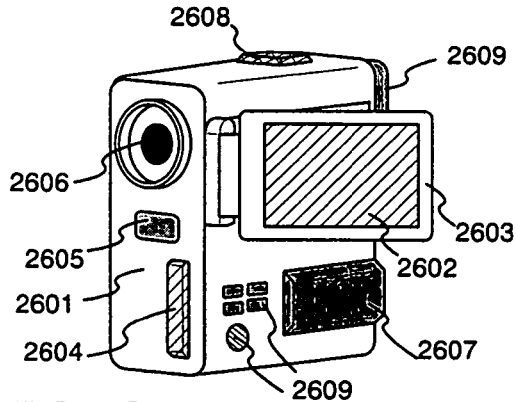

FIG. 6G shows a video camera, which includes a main body 2601, a display portion 2602, a housing 2603, an external connection port 2604, a remote control receiving portion 2605, an image receiving portion 2606, a battery 2607, an audio input portion 2608, an operation key 2609, and the like. The liquid crystal display device comprising the source follower circuit of the invention can be applied to the display portion 2602.

Figure 6H:
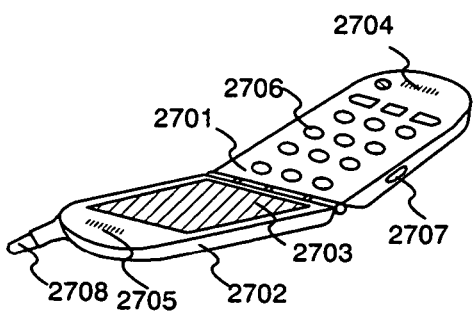

FIG. 6H shows a mobile telephone, which includes a main body 2701, a housing 2702, a display portion 2703, an audio input portion 2104, an audio output portion 2705, an operation key 2706, an external connection port 2707, an antenna 2708, and the like. The liquid crystal display device comprising the source follower circuit of the invention can be applied to the display portion 2703. Note that, by displaying white characters on a black background, the power consumption of the mobile telephone can be suppressed.

As described above, the invention can be applied to a wide range of electronic apparatuses in all fields. The electronic apparatuses in this embodiment may employ any of the source follower circuit, the bootstrap circuit, and the signal driver circuit described in Embodiment Modes 1 to 4.

According to the invention, a driver circuit using a polycrystalline silicon TFT can be operated without increasing a power supply voltage than a desired value. As a result, a power supply voltage of a liquid crystal display device having the driver circuit of the invention, a display device such as a light emitting device, and a semiconductor integrated circuit such as a CPU, memory and the like can be maintained low, thus a low power consumption can be realized.

Furthermore, by using a polycrystalline silicon TFT, a display device in which a pixel portion and a driver circuit are integrated can be provided.

The invention claimed is:
1. A driver circuit comprising:
a shift register;
a buffer circuit electrically connected to the shift register, comprising a source follower circuit comprising an n-channel thin film transistor; and an analog memory electrically connected to the buffer circuit, wherein:

a channel forming region of the n-channel thin film transistor comprises a polycrystalline semiconductor, the n-channel thin film transistor is a depletion mode transistor, an active layer of the n-channel thin film transistor contains an impurity at a concentration in a range of $5\times10^{12}$ to $5\times10^{14}$ atoms/cm$^2$, and as for the impurity, phosphorous is used to the n-channel thin film transistor.

2. The driver circuit according to claim 1,
wherein the n-channel thin film transistor is directly connected to an output terminal.

3. The driver circuit according to claim 1,
wherein the polycrystalline semiconductor film is provided over either a quartz substrate or a glass substrate.

4. The driver circuit according to claim 1, wherein the semiconductor layer of the n-channel thin film transistor comprises a metal element which is capable of promoting the crystallization of a semiconductor film.

5. The driver circuit according to claim 4, wherein the metal element is nickel.

6. A driver circuit comprising:

a shift register;

a buffer circuit electrically connected to the shift register, comprising a source follower circuit comprising an n-channel thin film transistor; and an analog memory electrically connected to the buffer circuit, wherein:

a channel forming region of the n-channel thin film transistor comprises a polycrystalline semiconductor which is formed by crystallizing an amorphous silicon, the n-channel thin film transistor is a depletion mode transistor, an active layer of the n-channel thin film transistor contains an impurity at a concentration in a range of $5\times10^{12}$ to $5\times10^{14}$ atoms/cm$^2$, and as for the impurity, phosphorous is used to the n-channel thin film transistor.

7. The driver circuit according to claim 6,
wherein the n-channel thin film transistor is directly connected to an output terminal.

8. The driver circuit according to claim 6,
wherein the polycrystalline semiconductor film is provided over either a quartz substrate or a glass substrate.

9. The driver circuit according to claim 6, wherein the semiconductor layer of the n-channel thin film transistor comprises a metal element which is capable of promoting the crystallization of a semiconductor film.

10. The driver circuit according to claim 9, wherein the metal element is nickel.

11. A driver circuit comprising:

a shift register;

a buffer circuit electrically connected to the shift register, comprising a bootstrap circuit comprising an n-channel thin film transistor; and an analog memory electrically connected to the buffer circuit, wherein:

a channel forming region of the n-channel thin film transistor comprises a polycrystalline semiconductor, the n-channel thin film transistor is a depletion mode transistor, an active layer of the n-channel thin film transistor contains an impurity at a concentration in a range of $5\times10^{12}$ to $5\times10^{14}$ atoms/cm$^2$, and as for the impurity, phosphorous is used to the n-channel thin film transistor.

12. The driver circuit according to claim 11,
wherein the n-channel thin film transistor is directly connected to an output terminal.

13. The driver circuit according to claim 11,
wherein the polycrystalline semiconductor film is provided over either a quartz substrate or a glass substrate.

14. The driver circuit according to claim 11, wherein the semiconductor layer of the n-channel thin film transistor comprises a metal element which is capable of promoting the crystallization of a semiconductor film.

15. The driver circuit according to claim 14, wherein the metal element is nickel.

16. A driver circuit comprising:

a shift register;

a buffer circuit electrically connected to the shift register, comprising a bootstrap circuit comprising an n-channel thin film transistor; and an analog memory electrically connected to the buffer circuit, wherein:

a channel forming region of the n-channel thin film transistor comprises a polycrystalline semiconductor which is formed by crystallizing an amorphous silicon, the n-channel thin film transistor is a depletion mode transistor, an active layer of the n-channel thin film transistor contains an impurity at a concentration in a range of $5\times10^{12}$ to $5\times10^{14}$ atoms/cm$^2$, and as for the impurity, phosphorous is used to the n-channel thin film transistor.

17. The driver circuit according to claim 16,
wherein the n-channel thin film transistor is directly connected to an output terminal.

18. The driver circuit according to claim 16,
wherein the polycrystalline semiconductor film is provided over either a quartz substrate or a glass substrate.

19. The driver circuit according to claim 16, wherein the semiconductor layer of the n-channel thin film transistor comprises a metal element which is capable of promoting the crystallization of a semiconductor film.

20. The driver circuit according to claim 19, wherein the metal element is nickel.

21. A driver circuit comprising:

a shift register;

a buffer circuit electrically connected to the shift register, comprising a source follower circuit comprising a p-channel thin film transistor; and an analog memory electrically connected to the buffer circuit, wherein:

a channel forming region of the p-channel thin film transistor comprises a polycrystalline semiconductor, the p-channel thin film transistor is a depletion mode transistor, an active layer of the p-channel thin film transistor contains an impurity at a concentration in a range of $5\times10^{12}$ to $5\times10^{14}$ atoms/cm$^2$, and as for the impurity, boron is used to the p-channel thin film transistor.

22. The driver circuit according to claim 21,
wherein the p-channel thin film transistor is directly connected to an output terminal.

23. The driver circuit according to claim 21,
wherein the polycrystalline semiconductor film is provided over either a quartz substrate or a glass substrate.

24. The driver circuit according to claim 21, wherein the semiconductor layer of the p-channel thin film transistor comprises a metal element which is capable of promoting the crystallization of a semiconductor film.

25. The driver circuit according to claim 24, wherein the metal element is nickel.

26. A driver circuit comprising:
a shift register;
a buffer circuit electrically connected to the shift register, comprising a source follower circuit comprising a p-channel thin film transistor; and
an analog memory electrically connected to the buffer circuit,
wherein:
a channel forming region of the p-channel thin film transistor comprises a polycrystalline semiconductor which is formed by crystallizing an amorphous silicon,
the p-channel thin film transistor is a depletion mode transistor,
an active layer of the p-channel thin film transistor contains an impurity at a concentration in a range of $5 \times 10^{12}$ to $5 \times 10^{14}$ atoms/cm$^2$, and
as for the impurity, boron is used to the p-channel thin film transistor.

27. The driver circuit according to claim 26,
wherein the p-channel thin film transistor is directly connected to an output terminal.

28. The driver circuit according to claim 26,
wherein the polycrystalline semiconductor film is provided over either a quartz substrate or a glass substrate.

29. The driver circuit according to claim 26, wherein the semiconductor layer of the p-channel thin film transistor comprises a metal element which is capable of promoting the crystallization of a semiconductor film.

30. The driver circuit according to claim 29, wherein the metal element is nickel.

31. A driver circuit comprising:
a shift register;
a buffer circuit electrically connected to the shift register, comprising a bootstrap circuit comprising a p-channel thin film transistor; and
an analog memory electrically connected to the buffer circuit,
wherein:
a channel forming region of the p-channel thin film transistor comprises a polycrystalline semiconductor,
the p-channel thin film transistor is a depletion mode transistor,
an active layer of the p-channel thin film transistor contains an impurity at a concentration in a range of $5 \times 10^{12}$ to $5 \times 10^{14}$ atoms/cm$^2$, and
as for the impurity, boron is used to the p-channel thin film transistor.

32. The driver circuit according to claim 31,
wherein the p-channel thin film transistor is directly connected to an output terminal.

33. The driver circuit according to claim 31,
wherein the polycrystalline semiconductor film is provided over either a quartz substrate or a glass substrate.

34. The driver circuit according to claim 31, wherein the semiconductor layer of the p-channel thin film transistor comprises a metal element which is capable of promoting the crystallization of a semiconductor film.

35. The driver circuit according to claim 34, wherein the metal element is nickel.

36. A driver circuit comprising:
a shift register;
a buffer circuit electrically connected to the shift register, comprising a bootstrap circuit comprising a p-channel thin film transistor; and
an analog memory electrically connected to the buffer circuit,
wherein:
a channel forming region of the p-channel thin film transistor comprises a polycrystalline semiconductor which is formed by crystallizing an amorphous silicon,
the p-channel thin film transistor is a depletion mode transistor,
an active layer of the p-channel thin film transistor contains an impurity at a concentration in a range of $5 \times 10^{12}$ to $5 \times 10^{14}$ atoms/cm$^2$, and
as for the impurity, boron is used to the p-channel thin film transistor.

37. The driver circuit according to claim 36, wherein the p-channel thin film transistor is directly connected to an output terminal.

38. The driver circuit according to claim 36, wherein the polycrystalline semiconductor film is provided over either a quartz substrate or a glass substrate.

39. The driver circuit according to claim 36, wherein the semiconductor layer of the p-channel thin film transistor comprises a metal element which is capable of promoting the crystallization of a semiconductor film.

40. The driver circuit according to claim 39, wherein the metal element is nickel.

* * * * *